(12) United States Patent
Cagno et al.

(10) Patent No.: US 8,093,868 B2
(45) Date of Patent: Jan. 10, 2012

(54) IN SITU VERIFICATION OF CAPACITIVE POWER SUPPORT

(75) Inventors: Brian J. Cagno, Tucson, AZ (US); John C. Elliott, Tucson, AZ (US); Robert A. Kubo, Tucson, AZ (US); Gregg S. Lucas, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 795 days.

(21) Appl. No.: 12/204,456

(22) Filed: Sep. 4, 2008

(65) Prior Publication Data

US 2010/0052625 A1 Mar. 4, 2010

(51) Int. Cl.
H01M 10/44 (2006.01)
H01M 10/46 (2006.01)

(52) U.S. Cl. ........................................................ 320/167

(58) Field of Classification Search .................. 320/107, 320/128, 137, 166, 167; 365/201, 227, 228, 365/229; 714/24, 25, 718; 713/324
See application file for complete search history.

(56) References Cited

U.S. PATENT DOCUMENTS

| | | | |
|---|---|---|---|
| 4,974,118 A | 11/1990 | Rounds | |
| 5,262,999 A | 11/1993 | Etoh et al. | |
| 5,430,674 A | 7/1995 | Javanifard | |
| 5,438,549 A | 8/1995 | Levy | |
| 5,496,939 A | 3/1996 | Maruyama | |
| 5,555,371 A | 9/1996 | Duyanovich et al. | |
| 5,644,531 A | 7/1997 | Kuo et al. | |
| 5,661,349 A | 8/1997 | Luck | |
| 5,732,238 A | 3/1998 | Sarkozy | |
| 5,793,776 A | 8/1998 | Qureshi et al. | |
| 5,944,837 A | 8/1999 | Talreja et al. | |
| 6,016,472 A | 1/2000 | Ali | |
| 6,236,593 B1 | 5/2001 | Hong et al. | |
| 6,282,670 B1 | 8/2001 | Rezaul Islam et al. | |
| 6,378,033 B1 | 4/2002 | Nishikawa | |
| 6,496,939 B2 * | 12/2002 | Portman et al. ............... | 713/340 |
| 6,658,435 B1 | 12/2003 | McCall | |
| 6,680,548 B2 | 1/2004 | Shiue et al. | |
| 6,785,786 B1 | 8/2004 | Gold et al. | |
| 7,143,298 B2 | 11/2006 | Wells et al. | |

(Continued)

FOREIGN PATENT DOCUMENTS

JP 2000194607 A 7/2000

(Continued)

OTHER PUBLICATIONS

U.S. Appl. No. 12/145,969, filed Jun. 25, 2008, Cagno et al.

(Continued)

*Primary Examiner* — Edward Tso
(74) *Attorney, Agent, or Firm* — Stephen R. Tkacs; Stephen K. Walder, Jr.; Randall J. Bluestone

(57) ABSTRACT

A mechanism for in situ verification of capacitive power support is provided. A memory system uses a super capacitor to support a voltage rail when input power is lost or interrupted. The voltage discharge curve is a function of load and capacitance of the component. By stepping the regulated power supply to a lower output within the voltage range and recording voltage and current draw at the super capacitor as it discharges to the new regulator output voltage, the super capacitor holdup capability can be tested.

20 Claims, 6 Drawing Sheets

U.S. PATENT DOCUMENTS

| | | | |
|---|---|---|---|
| 7,315,951 | B2 | 1/2008 | Hanrieder et al. |
| 7,451,348 | B2 | 11/2008 | Pecone et al. |
| 2002/0029354 | A1 | 3/2002 | Forehand et al. |
| 2004/0052502 | A1 | 3/2004 | Komatsu et al. |
| 2004/0218434 | A1 | 11/2004 | Hwang et al. |
| 2004/0224192 | A1 | 11/2004 | Pearson |
| 2005/0010838 | A1 | 1/2005 | Davies et al. |
| 2005/0063217 | A1 | 3/2005 | Shiraishi et al. |
| 2005/0283648 | A1 | 12/2005 | Ashmore |
| 2006/0015683 | A1* | 1/2006 | Ashmore et al. ............. 711/113 |
| 2006/0047985 | A1 | 3/2006 | Otani |
| 2006/0108875 | A1 | 5/2006 | Grundmann et al. |
| 2006/0212644 | A1 | 9/2006 | Acton et al. |
| 2006/0248269 | A1 | 11/2006 | Shona |
| 2006/0255746 | A1 | 11/2006 | Kumar et al. |
| 2006/0259756 | A1 | 11/2006 | Thompson et al. |
| 2006/0264188 | A1 | 11/2006 | Mars et al. |
| 2007/0002675 | A1 | 1/2007 | Koo |
| 2007/0033433 | A1 | 2/2007 | Pecone et al. |
| 2007/0133277 | A1 | 6/2007 | Kawai et al. |
| 2007/0180184 | A1 | 8/2007 | Sakashita et al. |
| 2008/0016385 | A1 | 1/2008 | Hollingsworth et al. |
| 2008/0086615 | A1 | 4/2008 | Elliott et al. |
| 2008/0201622 | A1 | 8/2008 | Hiew et al. |
| 2009/0254772 | A1 | 10/2009 | Cagno et al. |
| 2009/0323452 | A1 | 12/2009 | Cagno et al. |
| 2009/0327578 | A1 | 12/2009 | Cagno et al. |
| 2010/0011261 | A1 | 1/2010 | Cagno et al. |

FOREIGN PATENT DOCUMENTS

| | | | |
|---|---|---|---|
| JP | 2002312250 A | 10/2002 | |

OTHER PUBLICATIONS

U.S. Appl. No. 12/099,373, filed Apr. 8, 2008, Cagno et al.
U.S. Appl. No. 12/169,273, filed Jul. 8, 2008, Cagno et al.
U.S. Appl. No. 12/146,098, filed Jun. 25, 2008, Cagno et al.
"Patented Wear Leveling", BitMicro Networks, http://www.bitmicro.com/products_edisk_features_wearlevel.php, Printed Jul. 8, 2008, 2 pages.
"Method and Procedure to Minimize Peak Power Load During Backup of Volatile Memory with Flash Memory Devices", IBM Technical Disclosure, http://www.ip.com/pubview/IPCOM000167428D, Feb. 13, 2008, 6 pages.
U.S. Appl. No. 12/099,373.
U.S. Appl. No. 12/145,969.
U.S. Appl. No. 12/146,098.
U.S. Appl. No. 12/169,273.
Office Action mailed Feb. 3, 2011 for U.S. Appl. No. 12/169,273, 14 pages.
Office Action mailed Feb. 28, 2011 for U.S. Appl. No. 12/146,098; 18 pages.
Response to Office Action filed with the USPTO on Mar. 7, 2011 for U.S. Appl. No. 12/099,373; 14 pages.
Response to Office Action filed with the USPTO on Mar. 24, 2011 for U.S. Appl. No. 12/145,969; 19 pages.
Kim, Jesung et al. "A Space-Efficient Flash Translation Layer for CompactFlash Systems", IEEE Transactions on Consumer Electronics, May 2002, vol. 48, No. 2, pp. 366-375.
Thomasian, Alexander "Priority Queueing in Raid5 Disk Arrays with an NVS Cache", Modeling, analysis, and Simulation of Computer and Telecommunication Systems, 1995. MASCOTS '95., Proceedings of the Third International Workshop on, vol., No., pp. 168-172, Jan. 18-20, 1995 doi: 10.1109/MASCOT.1995.378692.
Varma, Anujan, et al. "Destage Algorithms for Disk Arrays with Nonvolatile Caches", Computers, IEEE Transactions on, vol. 47, No. 2, pp. 228-235, Feb. 1998 doi: 10.1109/12.663770, URL: http://ieeexplore.ieee.org/stamp/stamp.jsp?tp=&arnumber=663770&isnumber=14539.
Interview Summary mailed Apr. 28, 2011 for U.S. Appl. No. 12/169,273; 3 pages.
Response to Office Action filed with the USPTO on Apr. 29, 2011 for U.S. Appl. No. 12/169,273, 10 pages.
Response to Office Action filed with the USPTO on May 24, 2011 for U.S. Appl. No. 12/146,098, 15 pages.
"Using Compression to Expedite Hardening Process of a Non-Volatile Memory DIMM System", IBM Technical Disclosure, http://www.ip.com/pubview/IPCOM000167472D, Feb. 15, 2008, 4 pages.
Final Office Action mailed Jul. 28, 2011, for U.S. Appl. No. 12/145,098, 19 pages.
Notice of Allowability mailed Jun. 13, 2011 for U.S. 12/169,273; 3 pages.
Notice of Allowance mailed Jun. 9, 2011 for U.S. Appl. No. 12/145,969; 18 pages.
Notice of Allowance mailed Jun. 9, 2011 for U.S. Appl. No. 12/169,273, 9 pages.
Office Action mailed Jun. 22, 2011 for U.S. Appl. No. 12/099,373; 12 pages.
Supplemental Notice of Allowability mailed Jul. 29, 2011 for U.S. Appl. No. 12/145,969; 11 pages.
US 7,278,054, 10/2007, Davies et al. (withdrawn)

* cited by examiner

US 8,093,868 B2

IN SITU VERIFICATION OF CAPACITIVE POWER SUPPORT

BACKGROUND OF THE INVENTION

1. Field of the Invention

The present application relates generally to a dual mode memory system for in situ verification of capacitive power support.

2. Background of the Invention

A storage area network (SAN) is a network of storage disks. In large enterprises, a SAN connects multiple servers, or hosts, to a centralized pool of disk storage. Compared to managing hundreds of servers, each with its own disks, a SAN improves system administration. By treating all the company's storage as a single resource, disk maintenance and routine backups are easier to schedule and control. In some SANs, the disks themselves can copy data to other disks for backup without any processing overhead at the host computers.

A storage system typically comprises a plurality of storage devices and a storage controller in an enclosure. The storage controller may be a redundant array of independent disks (RAID) controller, for example. The storage controller receives host input/output (I/O) traffic to read and write data to the disk drives. The storage controller then reads data from or persists data to the disk drives via device I/O traffic. In storage systems, data is temporarily stored in volatile memory, such as Double Data Rate (DDR) Random Access Memory (RAM), due to the extremely fast access speeds that are required to meet maximum throughput to the disk drives.

BRIEF SUMMARY OF THE INVENTION

In one illustrative embodiment, a computer program product comprises a computer recordable medium having a computer readable program recorded thereon. The computer readable program, when executed on a computing device, causes the computing device to charge a super capacitor to a first voltage level by setting a voltage regulator output to the first voltage level. The voltage regulator provides power to a memory system. The computer readable program further causes the computing device to set the voltage regulator output to a second voltage level such that the memory system continues to operate at the second voltage level, monitor and record voltage and current discharge values at the super capacitor at regular intervals until a test period expires, calculate a capacitance of the super capacitor based on the recorded voltage and current discharge values, and determine whether the capacitance of the super capacitor will support hardening of cache data from a volatile memory to a non-volatile memory in the memory system in response to a power event.

In another illustrative embodiment, a method is provided in a data processing system for in situ verification of capacitive power support. The method comprises charging a super capacitor to a first voltage level by setting a voltage regulator output to the first voltage level. The voltage regulator provides power to a memory system. The method further comprises setting voltage regulator output to a second voltage level such that the memory system continues to operate at the second voltage level, monitoring and record voltage and current discharge values at the super capacitor at regular intervals until a test period expires, calculating a capacitance of the super capacitor based on the recording voltage and current discharge values, and determining whether the capacitance of the super capacitor will support hardening of cache data from a volatile memory to a non-volatile memory in response to a power event.

In another illustrative embodiment, a memory system comprises a controller, a volatile memory, and a non-volatile memory. The controller is configured to detect a power event from a voltage regulator that provides power to a storage controller and the memory system. The non-volatile memory is used to harden cache data from the volatile memory for a storage controller responsive to the power event. The controller is configured to charge a super capacitor to a first voltage level by setting a voltage regulator output to the first voltage level, set the voltage regulator output to a second voltage level such that the memory system continues to operate at the second voltage level, monitor and record voltage and current discharge values at the super capacitor at regular intervals until a test period expires, calculate a capacitance of the super capacitor based on the recorded voltage and current discharge values, and determine whether the capacitance of the super capacitor will support hardening of cache data from a volatile memory to a non-volatile memory in response to a power event.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The illustrative embodiments provide a mechanism for in situ verification of capacitive power support. A memory system uses a super capacitor to support a voltage rail when input power is lost or interrupted. The voltage discharge curve is a function of load and capacitance of the component. By stepping the regulated power supply to a lower output within the voltage range and recording voltage and current draw at the super capacitor as it discharges to the new regulator output voltage, the super capacitor holdup capability can be tested.

Figure 1:
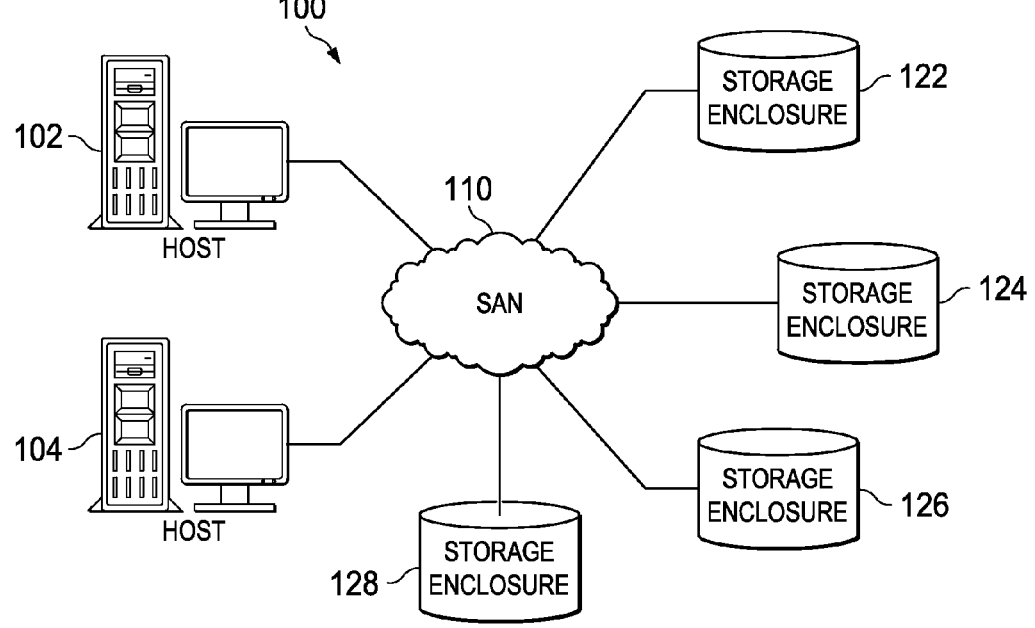
FIG. 1 depicts a pictorial representation of an exemplary distributed data processing system in which aspects of the illustrative embodiments may be implemented.
Figure 2:
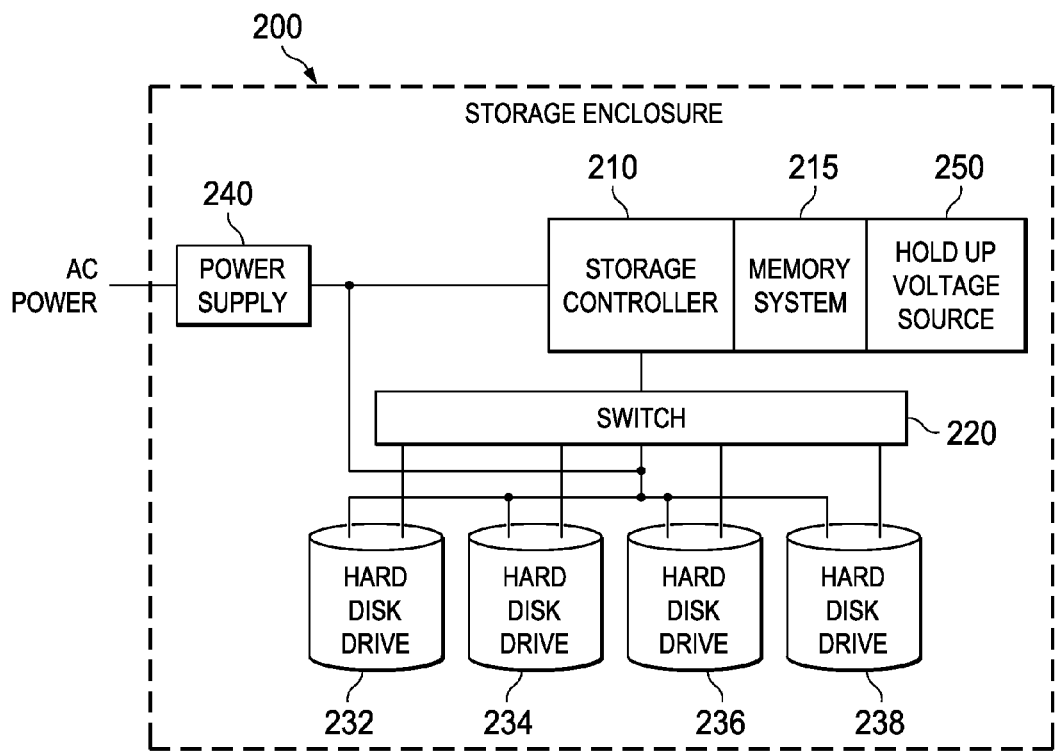
FIG. 2 is a block diagram depicting an exemplary storage enclosure in accordance with an illustrative embodiment.

The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as exemplary environments in which exemplary aspects of the illustrative embodiments may be implemented. While the description following FIGS. 1 and 2 will focus primarily on a storage enclosure implementation, this is only exemplary and is not intended to state or imply any limitation with regard to the features of the present invention. To the contrary, the illustrative embodiments are intended to include any embodiments in which a super-capacitor is used to temporarily hold up voltage for components.

With reference now to the figures and in particular with reference to FIGS. 1 and 2, exemplary diagrams of data processing environments are provided in which illustrative embodiments of the present invention may be implemented. It should be appreciated that FIGS. 1 and 2 are only exemplary and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an exemplary distributed data processing system in which aspects of the illustrative embodiments may be implemented. Distributed data processing system 100 may include a network of computers in which aspects of the illustrative embodiments may be implemented. The distributed data processing system 100 contains at least one storage area network 110, which is the medium used to provide communication links between various devices and computers, such as host computers and storage enclosures, connected together within distributed data processing system 100. Storage area network 110 may include connections, such as wire, wireless communication links, serial attached small computer systems interface (serial attached SCSI or SAS) switches, or fiber optic cables.

In the depicted example, host computer 102 and host computer 104 are connected to storage area network (SAN) 110 along with storage enclosures 122, 124, 126, and 128. A storage enclosure includes a storage controller and connection to one or more hard disk drives. The storage controller may be a simple controller for storing data to the hard disk drives, or alternatively may include a redundant array of independent disks (RAID) controller. Distributed data processing system 100 may include additional hosts, storage enclosures, clients, and other devices not shown.

In the depicted example, SAN 110 may use the Transmission Control Protocol/Internet Protocol (TCP/IP) suite of protocols to communicate with one another; however, more likely, SAN 110 may use a protocol associated with Fibre Channel (FC) or Serial attached SCSI (SAS). As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram depicting an exemplary storage enclosure in accordance with an illustrative embodiment. Storage enclosure 200 comprises storage controller 210, which may be a redundant array of independent disks (RAID) controller or a non-RAID controller. Storage controller 210 communicates with hard disk drives (HDDs) 232, 234, 236, and 238 through switch 220. Switch 220 may be, for example, a serial attached SCSI (SAS) switch. Other devices in a storage area network (SAN) may write data to or read data from storage enclosure 200 by connection to switch 220.

Storage controller 210 may store data temporarily in memory system 215 before persisting the data to HDDs 232-238. Memory system 215 may comprise a Double Data Rate (DDR) memory system that provides fast access speeds to meet required maximum throughput to HDDs 232-238. DDR memory is a volatile memory.

Power supply 240 receives alternating current (AC) power and provides direct current (DC) power to the components within storage enclosure 200. More particularly, power supply 240 provides DC power to storage controller 210, memory system 215, switch 220, and HDDs 232-238. If AC power to storage enclosure 200 is lost or interrupted, then there is a data integrity exposure within memory system 215.

One approach to solving data integrity exposure due to power failure is to hold up power to the entire enclosure using hold up voltage source 250 while the data is written to disk. This approach requires very large and expensive uninterruptible power supply (UPS) units. Another approach involves using a small battery and placing the memory into self refresh mode. Typically, a battery may allow the volatile memory to hold data for 72 hours. Even this battery can become large and expensive. Both solutions require chemical batteries to be used, which can also create safety hazards if not used or disposed of properly.

In accordance with an illustrative embodiment, memory system 215 includes a non-volatile storage element that is used to save data from the volatile memory when power is lost and a super capacitor that is used to hold up the voltage while the data is saved to non-volatile storage.

Figure 3:
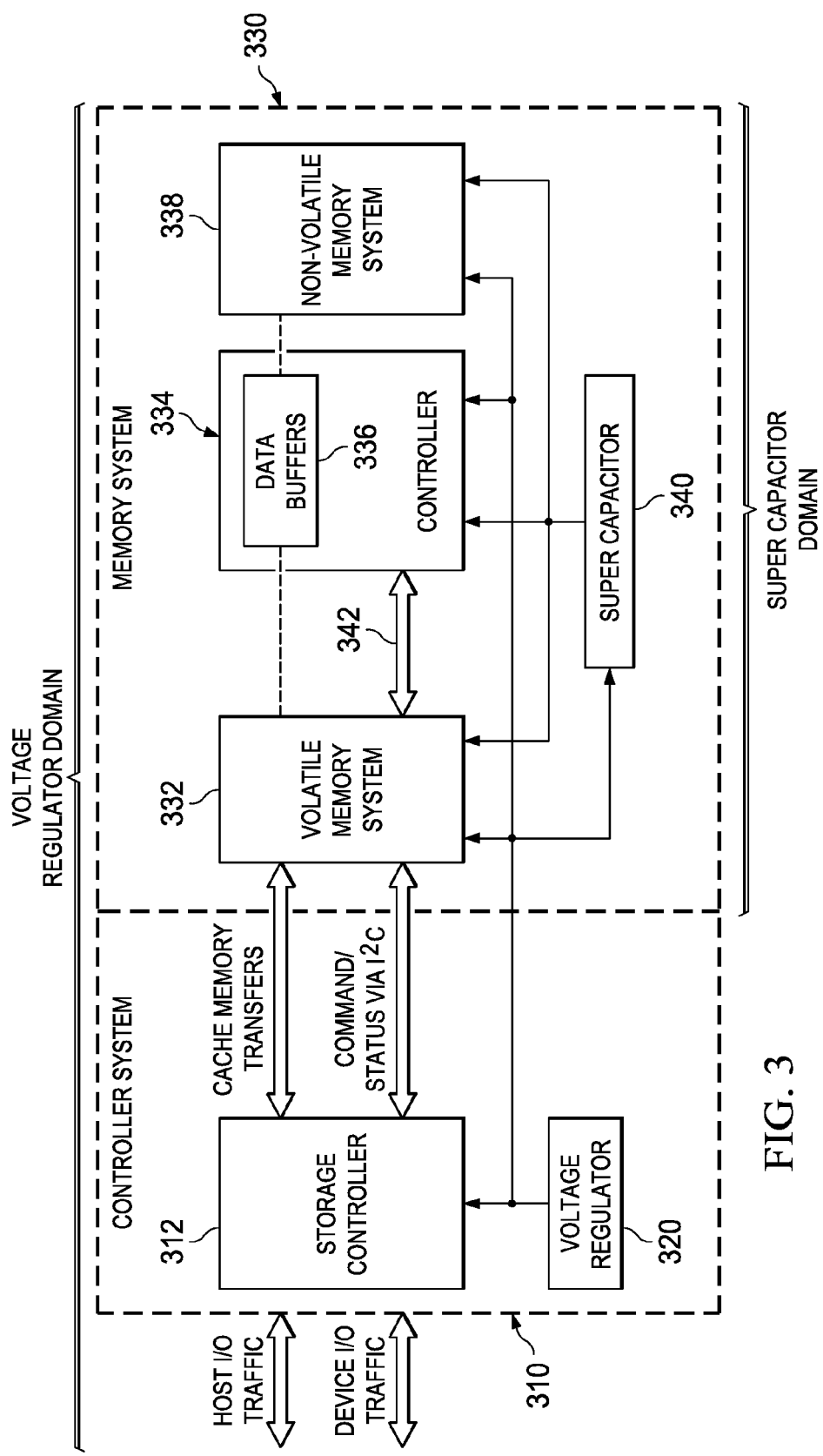
FIG. 3 is a block diagram illustrating a controller system and memory system in accordance with an illustrative embodiment.

FIG. 3 is a block diagram illustrating a controller system and memory system in accordance with an illustrative embodiment. Controller system 310 comprises storage controller 312 and voltage regulator 320. Controller system 310 receives host input/output (I/O) traffic to load data to or store data from the host. Controller system 310 also receives device I/O traffic to store data to or load data from storage devices. Storage controller 312 temporarily stores data in volatile memory system 332 within memory system 330 via cache memory transfers. Storage controller 312 also performs commands and updates status information using an inter-integrated circuit ($I^2C$) bus.

Memory system 330 comprises volatile memory system 332, non-volatile memory system 338, controller 334, and super capacitor 340. Volatile memory system 332 may be a Double Data Rate (DDR) memory, for example. Non-volatile memory system 338 may be a flash memory, for example. Controller 334 stores data from volatile memory system 332 to non-volatile memory system 338. Controller 334 may store data temporarily in data buffers 336 as data is transferred to non-volatile memory system 338.

Voltage regulator 320 provides direct current (DC) power to storage controller 312, volatile memory system 332, controller 334, and non-volatile memory system 338. Voltage regulator 320 may provide a voltage in the range of 3.0V to 3.5V, such as 3.3V, for example. However, the voltage may be higher or lower depending on the implementation. Voltage regulator 320 also provides DC power to charge super capacitor 340 to a predetermined voltage limit. Responsive to normal power being lost from voltage regulator 320, super capacitor 340 becomes the source of power for volatile memory system 332, controller 334, and non-volatile memory system 338.

As memory system 330 hardens the data (transfers the data from volatile memory system 332 to non-volatile memory system 338), super capacitor 340 begins to discharge. At some point, the voltage provided by super capacitor 340 begins to decay as a function of the load. When the voltage of super capacitor 340 falls below the minimum voltage requirement of memory system 330, operation may become nondeterministic and failures may occur.

In one exemplary embodiment, the volatile memory system 332 may be implemented as a Double Data Rate (DDR) memory, for example, such as in the form of a dual inline memory module (DIMM). Also, during normal operation, when AC power is lost and the cache data must be transferred to non-volatile memory system 338, it is very important that the process is as reliable and fast as possible. Thus, in one illustrative embodiment, memory system 330 comprises a mechanism for in situ verification of capacitive power support of super capacitor 340. The voltage discharge curve of super capacitor 340 is a function of load and capacitance of the component. By stepping the regulated power supply from voltage regulator 320 to a lower output within the voltage range and recording voltage and current draw at super capacitor 340 as it discharges to the new regulator output voltage, the super capacitor holdup capability can be tested.

Figure 4:
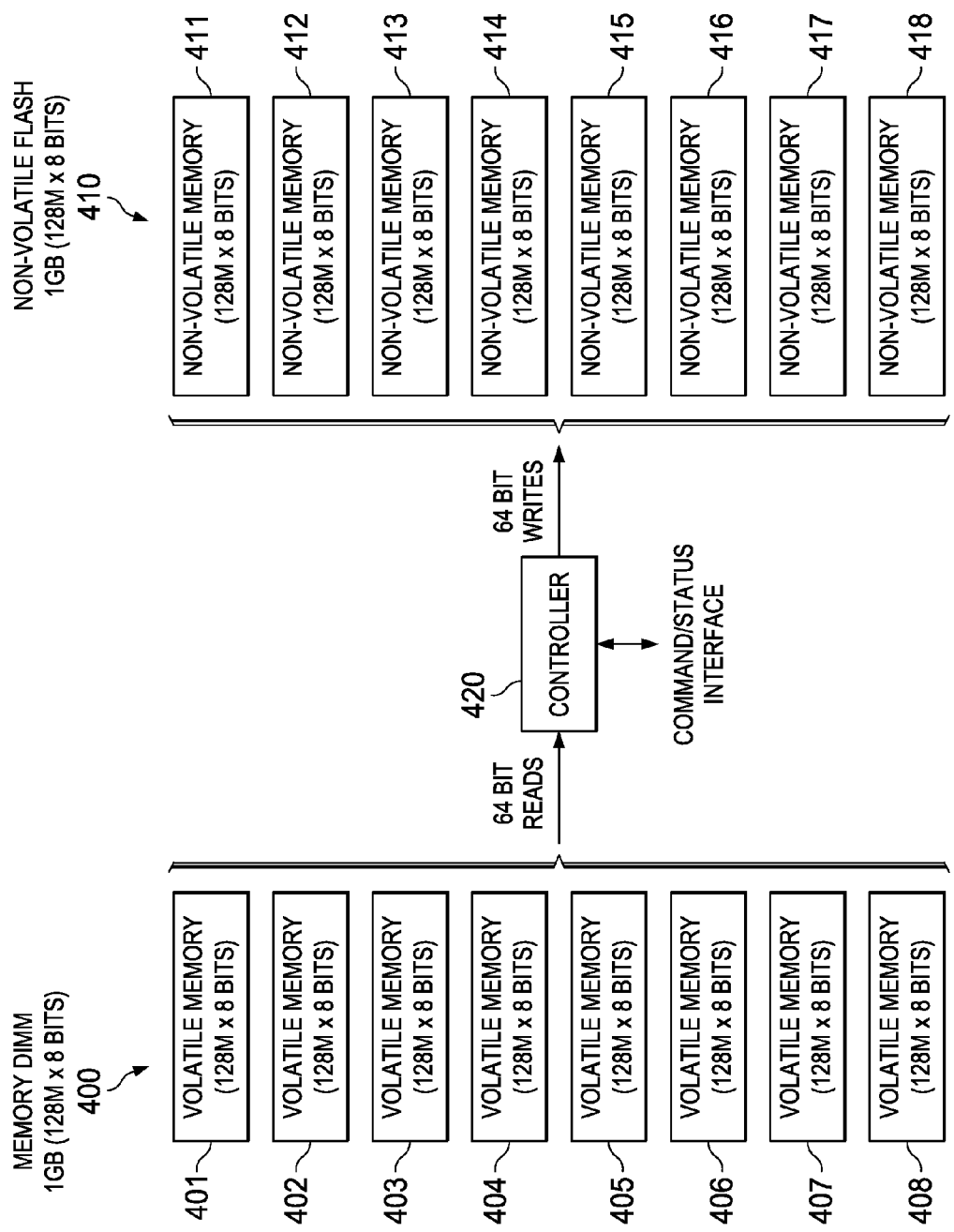
FIG. 4 illustrates a data hardening process in accordance with an illustrative embodiment.

FIG. 4 illustrates a data hardening process in accordance with an illustrative embodiment. Volatile memory dual inline memory module (DIMM) 400 comprises eight volatile memories 401-408. In the illustrative embodiment, volatile memories 401-408 may be 128M by 8 bits, with eight memories comprising 1 GB of memory. Non-volatile memory flash 410 comprises eight non-volatile memories 411-418. In the illustrative embodiment, non-volatile memories 411-418 may be 128M by 8 bits, with eight memories comprising 1 GB of memory to match that of volatile memory DIMM 400.

In response to a power event, such as an early power off warning (EPOW), controller 420 hardens the data in volatile memory DIMM 400 to non-volatile flash 410 by making 64 bit reads from volatile memories 401-408 and making 64 bit writes to non-volatile memories 411-418. Controller 420 may send and receive commands and status information in communication with volatile memory DIMM 400, non-volatile flash 410, and the storage controller (not shown).

Using super capacitor technology, a significantly large super capacitor may be required to hold up the memory system during the entire hardening process. To fit the entire memory system, including memory DIMM 400, controller 420, and non-volatile flash 410 on the same module, a non-volatile dual inline memory module (NVDIMM), it is paramount to reduce the super capacitor size to its smallest size/volume while still providing sufficient capacitive power to support the hardening process. The super capacitor capacity is a function of how much memory must be hardened, how long the hardening process takes, and any associated power load that must be supported. Because the storage capacity of the super capacitor is insufficient for testing under full operational mode, a mechanism is provided to validate the super capacitor that does not impact the data hardening process.

Figure 5:
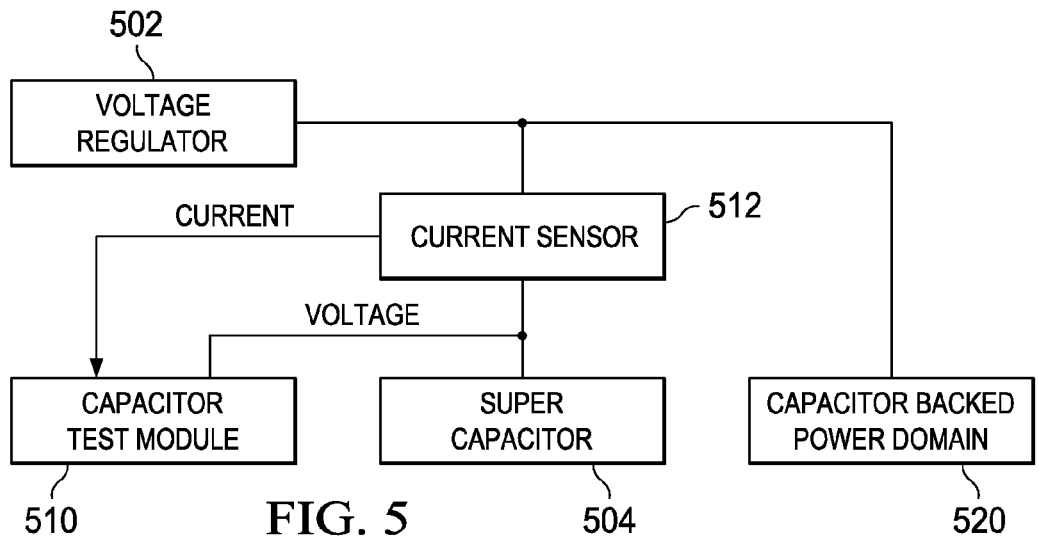
FIG. 5 is a block diagram illustrating a mechanism for in situ verification of capacitive power support in accordance with an illustrative embodiment.

FIG. 5 is a block diagram illustrating a mechanism for in situ verification of capacitive power support in accordance with an illustrative embodiment. Voltage regulator 502 provides power to charge super capacitor 504. In the event that voltage regulator 502 fails to provide power, super capacitor 504 provides a holdup voltage to capacitor backed power domain 520, which has a known load, or impedance.

During normal operation of voltage regulator 502, voltage regulator 502 is shifted up to a maximum tolerance of the system it feeds. That is, voltage regulator 502 is configured to provide a maximum voltage that can be tolerated by its power domain. The mechanism allows a sufficient amount of time to pass for super capacitor 504 to charge to this new level and for current flow at current sensor 512 to diminish to near zero. Then, the mechanism shifts the voltage regulator output down to a lowest allowable output. In other words, voltage regulator 502 is configured to provide a minimum voltage at which the system still operates without failure. Capacitor test module 510 measures and records the voltage and current being drawn from super capacitor 504 at regular time intervals. The resulting relationship of current and voltage during the discharge may be used to calculate the capacitance of super capacitor 504.

In one exemplary embodiment, capacitor test module 510 may be a dedicated controller, specific hardware, or a combination of software and hardware. In one exemplary embodiment, capacitor test module 510 may be controller 334 of FIG. 3. In this example, capacitor test module 510 may post status information concerning the health of super capacitor 504, as well as commands for voltage regulator 502 to storage controller 312 and voltage regulator 320 via an I$^2$C interface, such as bus 342 in FIG. 3, for example.

Figure 6:
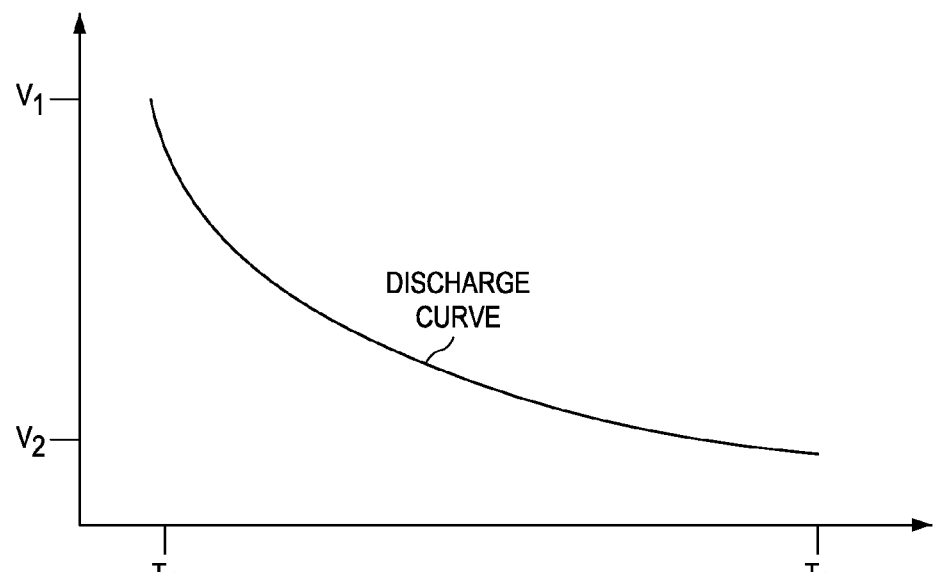
FIG. 6 is a discharge curve for in situ verification of capacitive power support in accordance with an illustrative embodiment.

FIG. 6 illustrates a discharge curve for in situ verification of capacitive power support in accordance with an illustrative embodiment. At time $T_1$, the voltage of the super capacitor may be $V_1$, which may be the maximum voltage that the system will tolerate. After a predetermined test period, at time $T_2$, the voltage at the super capacitor may be $V_2$. This represents a discharge curve for voltage. Current will have a similar discharge curve.

In one exemplary embodiment, the test period may be a predetermined period of time, where $T_2-T_1$ is a predetermined value. In an alternative embodiment, the test period may be the amount of time it takes the super capacitor to discharge from the maximum voltage, $V_1$, to a predetermined threshold voltage, $V_2$.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 7:
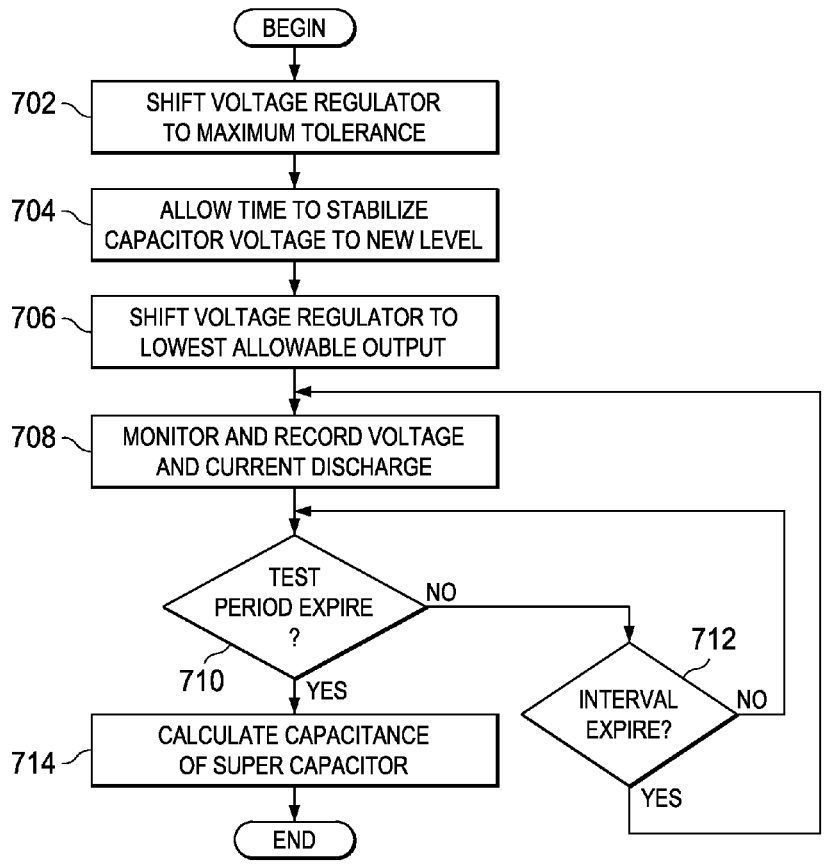
FIG. 7 is a flowchart illustrating background verification of the non-volatile memory system in accordance with an illustrative embodiment.

FIG. 7 is a flowchart illustrating operation of a mechanism for in situ verification of capacitive power support in accordance with an illustrative embodiment. Operation begins, and the mechanism shifts the voltage regulator to a maximum tolerance (block 702). That is, the voltage regulator is configured to provide a maximum voltage that can be tolerated by its power domain. The mechanism allows a sufficient amount of time to pass for the super capacitor to charge to this new level and for current flow to diminish to near zero (block 704). Then, the mechanism shifts the voltage regulator output down to a lowest allowable output (block 706). In other words, the voltage regulator is configured to provide a minimum voltage at which the system still operates without failure.

Next, the mechanism monitors and records the voltage and current being drawn from the super capacitor (block 708). The mechanism determines whether a test period expires (block 710). In one exemplary embodiment, the test period may be a predetermined period of time. In an alternative embodiment, the test period may be the amount of time it takes the super capacitor to discharge from the maximum voltage to a predetermined threshold voltage. If the test period does not expire in block 710, the mechanism determines whether a time interval expires (block 712). The mechanism monitors and records voltage and current at regular intervals to form a discharge curve. If the interval does not expire in block 712, operation returns to block 710 to determine whether the test period expires. If the interval does expire in block 712, operation returns to block 708 to monitor and record new voltage and current values.

If the test period expires in block 710, the mechanism calculates the capacitance of the super capacitor given the voltage and current discharge curve information (block 714). Given this discharge information, the mechanism may calculate capacitance and determine whether the super capacitor has sufficient capacitive power to support the hardening process. Thereafter, operation ends.

Charging a super capacitor causes the super capacitor to degrade over time. Thus, even if the memory system does not experience a power failure, merely charging the super capacitor for testing purposes causes the super capacitor to age. If the super capacitor holds a charge to power the memory system for any length of time, then this causes the super capacitor to age further. In one illustrative embodiment, the memory system may include a non-powered redundant super capacitor. If the memory system determines that the holdup capacitor of the main super capacitor is not sufficient to support the memory system, then the memory system may failover to the non-powered redundant super capacitor.

Figure 8:
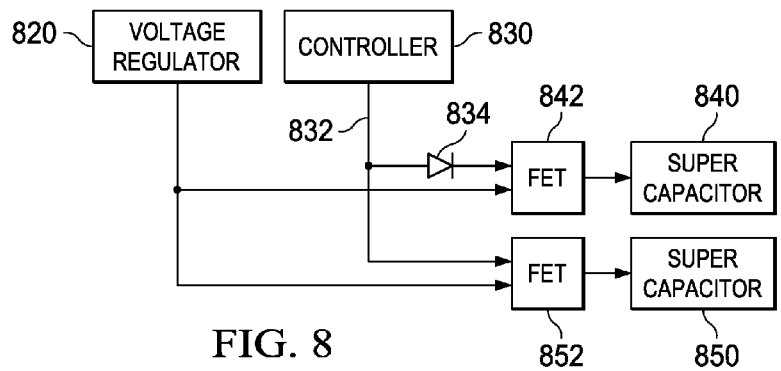
FIG. 8 is a block diagram depicting a memory system with a redundant non-powered super capacitor in accordance with an illustrative embodiment.

FIG. 8 is a block diagram depicting a memory system with a redundant non-powered super capacitor in accordance with an illustrative embodiment. Voltage regulator 820 may charge either super capacitor 840 or super capacitor 850 depending upon which field effect transistor (FET) 842 or 852 is enabled. Controller 830 provides an enable/disable signal 832 to FET 842 and FET 852, with enable/disable signal 832 going to FET 842 being inverted by inverter 834. Thus, given that super capacitor 840 is the main super capacitor, controller 830 may deassert signal 832 to enable FET 842 and disable FET 852. That is, with enable/disable signal 832 being deasserted, voltage regulator 820 powers super capacitor 840, while super capacitor 850 is non-powered.

Controller 830 may test the holdup capacity of super capacitor 840, for example, as described above. If controller 830 determines that the holdup capacity of super capacitor 840 is insufficient to power the memory system in the event of a power failure, then controller 830 may assert enable/disable signal 832 to disable FET 842 and enable FET 852. With enable/disable signal 832 being asserted, voltage regulator 820 powers super capacitor 850, while super capacitor 840 is non-powered.

When a single super capacitor is used and fails, the storage system may operate properly until a power failure. However, in the case of a power failure, any unwritten data may be lost due to the failed super capacitor. Thus, a failed super capacitor may require a service action to replace the NVDIMM with a module that has a working super capacitor. However, the failover super capacitor in FIG. 8 allows the storage system to continue operating, even in case of a power failure, if the main super capacitor is defective or degrades over time to a point at which the charge capacity is insufficient.

Figure 9:
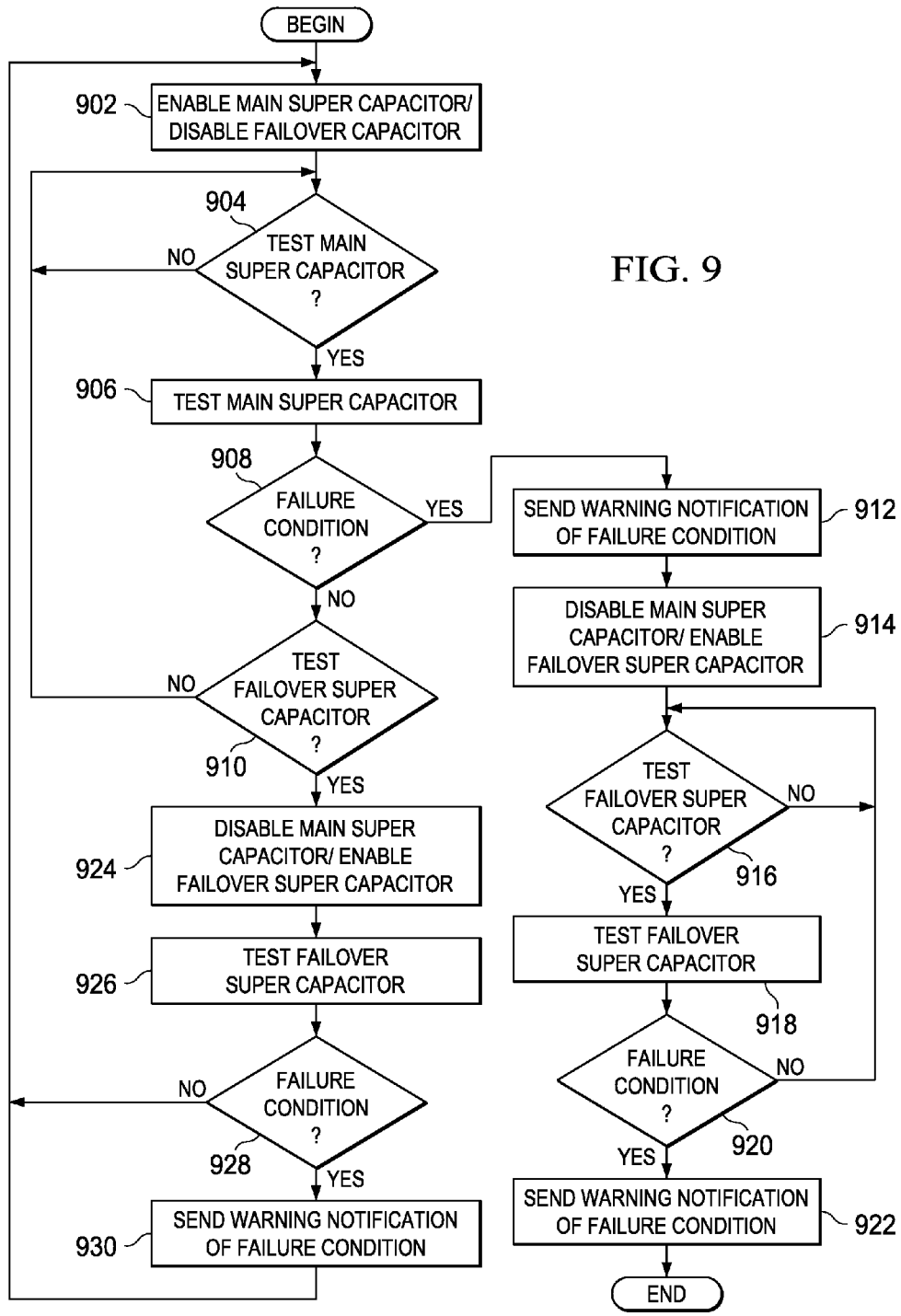
FIG. 9 is a flowchart illustrating operation of a mechanism for in situ verification of capacitive power support with redundant backup voltage source in accordance with an illustrative embodiment.

FIG. 9 is a flowchart illustrating operation of a mechanism for in situ verification of capacitive power support with redundant backup voltage source in accordance with an illustrative embodiment. Operation begins, and the mechanism enables the main super capacitor and disables the failover super capacitor (block 902). The mechanism determines whether to test the main super capacitor (block 904). The mechanism may test the main super capacitor periodically, based on a schedule, or responsive to a command from the storage controller, for example. If the mechanism determines not to test the main super capacitor in block 904, operation returns to block 904 to determine whether to test the main super capacitor.

If the mechanism makes a determination to test the main super capacitor in block 904, the mechanism tests the main super capacitor as described above (block 906). Then, the mechanism determines whether the test of the main super capacitor results in a failure condition (block 908). If the test does not result in a failure condition, the mechanism determines whether to test the failover super capacitor (block 910). The mechanism may test the failover super capacitor periodically, based on a schedule, or responsive to a command from the storage controller, for example. As a specific example, the mechanism may test the failover super capacitor every one hundred times it tests the main super capacitor, for instance. If the mechanism makes a determination not to test the failover super capacitor, operation returns to block 904 to determine whether to test the main super capacitor.

Returning to block 908, if the test results in a failure condition, the mechanism sends a warning notification of the failure condition to the storage controller (block 912). The mechanism then disables the main super capacitor and enables the failover super capacitor (block 914). Then, the mechanism determines whether to test the failover super capacitor (block 916). If the mechanism determines not to test the failover super capacitor, operation returns to block 916 to determine whether to test the failover super capacitor. If the mechanism determines to test the failover super capacitor, the mechanism tests the failover super capacitor as described above (block 918) and determines whether a failure condition exists (block 920). If the test does not result in a failure condition, operation returns to block 916 to determine whether to test the failover super capacitor.

If the test results in a failover condition in block 920, the mechanism sends a warning notification of the failure condition to the storage controller (block 922). Thereafter, operation ends. Because the test of the main super capacitor in block 906 resulted in a failure condition and the test of the failover super capacitor in block 918 resulted in a failure condition, a service action is necessary before a power failure occurs to ensure that no unwritten data is lost.

Returning to block 910, if the mechanism determines to test the failover super capacitor, the mechanism disables the main super capacitor and enables the failover super capacitor (block 924). Then, the mechanism tests the failover super capacitor as described above (block 926) and determines whether a failure condition exists (block 928). If the test does not result in a failure condition, operation returns to block 902 to enable the main super capacitor and disable the failover super capacitor. If the test results in a failure condition in block 928, the mechanism sends a warning notification of the failure condition to the storage controller (block 930), and operation returns to block 902 to enable the main super capacitor and disable the failover super capacitor.

Thus, the illustrative embodiments provide mechanisms for in situ verification of capacitive power support is provided. A memory system uses a super capacitor to support a voltage rail when input power is lost or interrupted. The voltage discharge curve is a function of load and capacitance of the component. By stepping the regulated power supply to a lower output within the voltage range and recording voltage and current draw at the super capacitor as it discharges to the new regulator output voltage, the super capacitor holdup capability can be tested.

As noted above, it should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a computer recordable medium having a computer readable program recorded thereon, wherein the computer readable program, when executed on a computing device, causes the computing device to:
   charge a super capacitor to a first voltage level by setting a voltage regulator output to the first voltage level, wherein the voltage regulator provides power to a memory system;
   set the voltage regulator output to a second voltage level such that the memory system continues to operate at the second voltage level;
   monitor and record voltage and current discharge values at the super capacitor at regular intervals until a test period expires;
   calculate a capacitance of the super capacitor based on the recorded voltage and current discharge values; and
   determine whether the capacitance of the super capacitor will support hardening of cache data from a volatile memory to a non-volatile memory in the memory system in response to a power event.

2. The computer program product of claim 1, wherein the voltage regulator charges the super capacitor.

3. The computer program product of claim 2, wherein charging the super capacitor to a first voltage level comprises:
   configuring the voltage regulator to provide a maximum voltage that can be tolerated by a system that the voltage regulator supports.

4. The computer program product of claim 3, wherein charging the super capacitor to a first voltage level further comprises:
   waiting a period of time to stabilize the super capacitor voltage to the first voltage level.

5. The computer program product of claim 1, wherein setting the voltage regulator output to a second voltage level further comprises:
   configuring the voltage regulator to provide a minimum voltage at which the system can still operate without failure.

6. The computer program product of claim 1, wherein the time period is a predetermined amount of time.

7. The computer program product of claim 1, wherein the time period is an amount of time it takes for the super capacitor to discharge from the first voltage level to a predetermined second voltage level.

8. The computer program product of claim 1, wherein the super capacitor is a main super capacitor and wherein the computer readable program further causes the computing device to:
   responsive to a determination that the capacitance of the super capacitor will not support hardening of cache data from the volatile memory to the non-volatile memory, fail over to a failover super capacitor.

9. The computer program product of claim 8, wherein the computer readable program further causes the computing device to:
   charge the failover super capacitor to the first voltage level by setting the voltage regulator output to the first voltage level;
   set the voltage regulator output to the second voltage level;
   monitor and record voltage and current discharge values at the failover super capacitor at regular intervals until the test period expires;
   calculate a capacitance of the failover super capacitor based on the recorded voltage and current discharge values; and
   determine whether the capacitance of the failover super capacitor will support hardening of cache data from the volatile memory to the non-volatile memory in the memory system in response to a power event.

10. The computer program product of claim 8, wherein failing over to the failover super capacitor comprises:
    disabling a field effect transistor between the voltage regulator and the main super capacitor and enabling a field effect transistor between the voltage regulator and the failover super capacitor.

11. A method, in a data processing system, for in situ verification of capacitive power support, the method comprising:
    charging a super capacitor to a first voltage level by setting a voltage regulator output to the first voltage level, wherein the voltage regulator provides power to a memory system;
    setting voltage regulator output to a second voltage level such that the memory system continues to operate at the second voltage level;
    monitoring and recording voltage and current discharge values at the super capacitor at regular intervals until a test period expires;
    calculating a capacitance of the super capacitor based on the recorded voltage and current discharge values; and
    determining whether the capacitance of the super capacitor will support hardening of cache data from a volatile memory to a non-volatile memory in response to a power event.

12. The method of claim 11, wherein the voltage regulator charges the super capacitor.

13. The method of claim 12, wherein charging the super capacitor to a first voltage level comprises:
    configuring the voltage regulator to provide a maximum voltage that can be tolerated by a system that the voltage regulator supports.

14. The method of claim 13, wherein charging the super capacitor to a first voltage level further comprises:
    waiting a period of time to stabilize the super capacitor voltage to the first voltage level.

15. The method of claim 12, wherein setting the voltage regulator output to a second voltage level further comprises:
    configuring the voltage regulator to provide a minimum voltage at which the system can still operate without failure.

16. The method of claim 11, wherein the time period is a predetermined amount of time.

17. The method of claim 11, wherein the time period is an amount of time it takes for the super capacitor to discharge from the first voltage level to a predetermined second voltage level.

18. A memory system comprising:
    a controller, wherein the controller is configured to detect a power event from a voltage regulator that provides power to a storage controller and the memory system;
    a volatile memory; and a non-volatile memory, wherein the non-volatile memory is used to harden cache data from the volatile memory for a storage controller responsive to the power event;

wherein the controller is configured to charge a super capacitor to a first voltage level by setting a voltage regulator output to the first voltage level, set the voltage regulator output to a second voltage level such that the memory system continues to operate at the second voltage level, monitor and record voltage and current discharge values at the super capacitor at regular intervals until a test period expires, calculate a capacitance of the super capacitor based on the recorded voltage and current discharge values, and determine whether the capacitance of the super capacitor will support hardening of cache data from a volatile memory to a non-volatile memory in response to a power event.

19. The memory system of claim 18, wherein the voltage regulator charges the super capacitor and wherein charging the super capacitor to a first voltage level comprises:

configuring the voltage regulator to provide a maximum voltage that can be tolerated by a system that the voltage regulator supports;

waiting a period of time to stabilize the super capacitor voltage to the first voltage level.

20. The memory system of claim 18, wherein setting the voltage regulator output to a second voltage level further comprises:

configuring the voltage regulator to provide a minimum voltage at which the system can still operate without failure.

\* \* \* \* \*